United States Patent
Natori et al.

(10) Patent No.: US 9,231,182 B2
(45) Date of Patent: Jan. 5, 2016

(54) ANGULAR VELOCITY SENSOR

(71) Applicant: TDK CORPORATION, Tokyo (JP)

(72) Inventors: Hirofumi Natori, Tokyo (JP); Kenichi Tochi, Tokyo (JP); Akihiro Unno, Tokyo (JP); Takashi Aoyagi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/718,645

(22) Filed: May 21, 2015

(65) Prior Publication Data

US 2015/0340588 A1    Nov. 26, 2015

(30) Foreign Application Priority Data

May 26, 2014 (JP) .................................. 2014-108191

(51) Int. Cl.
*H01L 41/047* (2006.01)
*G01C 19/5607* (2012.01)

(52) U.S. Cl.
CPC .......... *H01L 41/047* (2013.01); *G01C 19/5607* (2013.01)

(58) Field of Classification Search
CPC ........................................................ H03H 9/21
USPC ........................... 310/370; 73/504.02, 504.16
See application file for complete search history.

(56) References Cited

U.S. PATENT DOCUMENTS

| | | | | |
|---|---|---|---|---|
| 7,107,843 B2* | 9/2006 | Ohuchi | ............... | G01C 19/5614 73/504.12 |
| 7,260,990 B2* | 8/2007 | Ohuchi | ............... | G01C 19/5607 73/504.12 |
| 7,387,025 B2* | 6/2008 | Nozoe | ................ | G01C 19/5607 73/1.37 |
| 7,567,023 B2* | 7/2009 | Iwaki | ....................... | H03H 3/04 310/324 |
| 8,201,450 B2* | 6/2012 | Ohuchi | .................. | G01C 19/56 73/504.12 |
| 2004/0187574 A1* | 9/2004 | Hayashi | ............. | G01C 19/5663 73/514.16 |
| 2005/0029606 A1* | 2/2005 | Nakanishi | .......... | G01C 19/5607 257/414 |
| 2005/0269904 A1* | 12/2005 | Oka | ........................ | H03H 3/02 310/324 |
| 2007/0120449 A1* | 5/2007 | Aizawa | .............. | G01C 19/5621 310/370 |
| 2007/0163344 A1* | 7/2007 | Ohuchi | ............. | G01C 19/5607 73/504.16 |
| 2007/0195134 A1* | 8/2007 | Lee | ...................... | B41J 2/14233 347/72 |
| 2010/0117493 A1* | 5/2010 | Hayashi | ................... | B41J 2/161 310/364 |

FOREIGN PATENT DOCUMENTS

JP    2010-135595 A    6/2010

* cited by examiner

*Primary Examiner* — J. San Martin
(74) *Attorney, Agent, or Firm* — Oliff PLC

(57) ABSTRACT

In a piezoelectric element, a piezoelectric film, a first electrode film provided on one surface of the piezoelectric film, and a second electrode film provided on the other surface of the piezoelectric film form a layered structure, an outer contour of the first electrode film and an outer contour of the second electrode film are positioned outside an outer contour of the piezoelectric film as viewed in a layering direction, an organic resin film is in contact with the piezoelectric film, and generation of noise is suppressed.

2 Claims, 4 Drawing Sheets

ANGULAR VELOCITY SENSOR

BACKGROUND OF THE INVENTION

1. Field of the Invention

The present invention relates to an angular velocity sensor using a piezoelectric element.

2. Related Background Art

As angular velocity sensors used for controlling attitudes of moving bodies such as vehicles, typically, ones having various shapes such as an alphabetical H-shaped one, a pillar-shaped one, and a tuning fork-shaped one are known.

These angular velocity sensors are configured from a base, a drive electrode part, and a detection electrode part. Electrode parts for input/output extraction to/from an outside are provided on an upper surface of the base. The electrode parts for input/output extraction are connected with the drive electrode part and the detection electrode part with electrode wires and electrode pads. Each of the electrode parts includes a piezoelectric element having a piezoelectric film. The piezoelectric film sandwiched by an upper electrode and a lower electrode, of the piezoelectric element, has piezoelectric characteristics, and causes distortion when being applied a voltage and causes a potential when mechanically distorted. By use of the characteristics, the piezoelectric element excites the drive electrode part of the angular velocity sensor. When an angular velocity is applied to the angular velocity sensor, the drive electrode part is distorted by Coriolis' force, and a potential is caused in the detection electrode part, accordingly. By detecting of the potential, the angular velocity provided to the angular velocity sensor can be detected. Note that the angular velocity sensor is mounted on a base or the like, then connected with an external circuit by wire bonding or the like, and packaged with an IC that is a processing circuit, thereby to become the angular velocity sensor.

As the piezoelectric element used in such an angular velocity sensor, for example, Patent Document 1 has proposed a piezoelectric element in which a first surface (lower surface) of a piezoelectric body, on which a first electrode (lower electrode) is provided, is formed into a shape having a contour at an outer side than a contour of a second surface (upper surface) of a piezoelectric body, on which a second electrode (upper electrode) is provided, the contour being projected on the first surface (lower surface), the first electrode (lower electrode) is formed into a shape that is the same as or larger than the contour of the first surface (lower surface), and the second electrode (upper electrode) is formed into a shape that is the same as or smaller than the contour of the second surface (upper surface), thereby to effectively prevent a short circuit between the electrodes without increasing resonance performance of the piezoelectric element.

(Patent Document 1) Japanese Patent Application Laid-Open No. 2010-135595 A

SUMMARY OF THE INVENTION

Design of the upper and lower electrodes has been proposed to be formed into a shape that is the same as or smaller than the contour of the piezoelectric body, in terms of prevention of short circuit or a close contact property. However, according to the examination of the present inventors, it has been found that, even if the design of the conventional technology is conducted, noise is superimposed on a signal that indicates displacement.

According to the examination of the present inventors, the upper and lower electrodes may also function as vibrators. The electrodes as the vibrators may vibrate in a different mode from the above-described drive electrode part. As a result, deformation different from the distortion of the drive electrode part by Coriolis' force is applied to the piezoelectric film. As a result, the piezoelectric film generates an electrical signal caused by the vibration other than a detection purpose and the signal may be a cause of noise.

The present invention has been made in view of the problem, and an objective is to provide an angular velocity sensor using a piezoelectric element that suppresses generation of noise.

In order to solve the above-mentioned problem, the angular velocity sensor of the present invention includes a drive arm to which a piezoelectric element is fixed, the piezoelectric element including a piezoelectric film; a first electrode film provided on one surface side of the piezoelectric film; and a second electrode film provided on the other surface side of the piezoelectric film, wherein when a direction perpendicular to both of a longitudinal direction of the drive arm and a thickness direction of the piezoelectric film is the width direction a dimension La of the first electrode film in a width direction, a dimension Lc of the second electrode film in the width direction, and a dimension Lb of the piezoelectric film in the width direction satisfy following relationship:

$$Lc \times 0.95 \leq La \leq Lc \times 1.05, \tag{1}$$

$$Lb < La, \text{ and} \tag{2}$$

$$Lb < Lc. \tag{3}$$

According to the angular velocity sensor, La and Lc are approximately equal, and thus the piezoelectric element performs harmonized vibration, and Lb is smaller than La and Lc, and thus a voltage is reliably and uniformly applied to the piezoelectric film through the electrodes. Therefore, noise mixed into a detection signal due to vibration of the piezoelectric element can be suppressed. Note that the detection signal can be taken out of the piezoelectric element provided on the drive arm, or can be taken out of a piezoelectric element provided on a detection arm mechanically coupled with the drive arm.

Further, the piezoelectric element of the angular velocity sensor according to the present invention further includes an organic resin film provided to be in contact with at least: (1) a side surface of the piezoelectric film along a plane including both of a longitudinal direction and a thickness direction; (2) a region that is a surface region of the second electrode film positioned outside the piezoelectric film in the width direction, and facing the first electrode film, and (3) a region that is a surface region of the first electrode film positioned outside the piezoelectric film in the width direction, and facing the second electrode film.

According to the angular velocity sensor, the piezoelectric element is covered with the organic resin film, so that vibration of a part of the electrode film protruding toward a side is suppressed, and the vibration becomes stable. Therefore, inclusion of noise in the detection signal can be suppressed.

According to the present invention, a piezoelectric element that suppresses generation of noise, and an angular velocity sensor using the piezoelectric element can be provided.

DESCRIPTION OF THE PREFERRED EMBODIMENTS

Hereinafter, favorable embodiments will be described in detail with reference to the appended drawings. Note that the same elements or elements having the same function are denoted with the same reference sign, and overlapping description is omitted.

Figure 1:
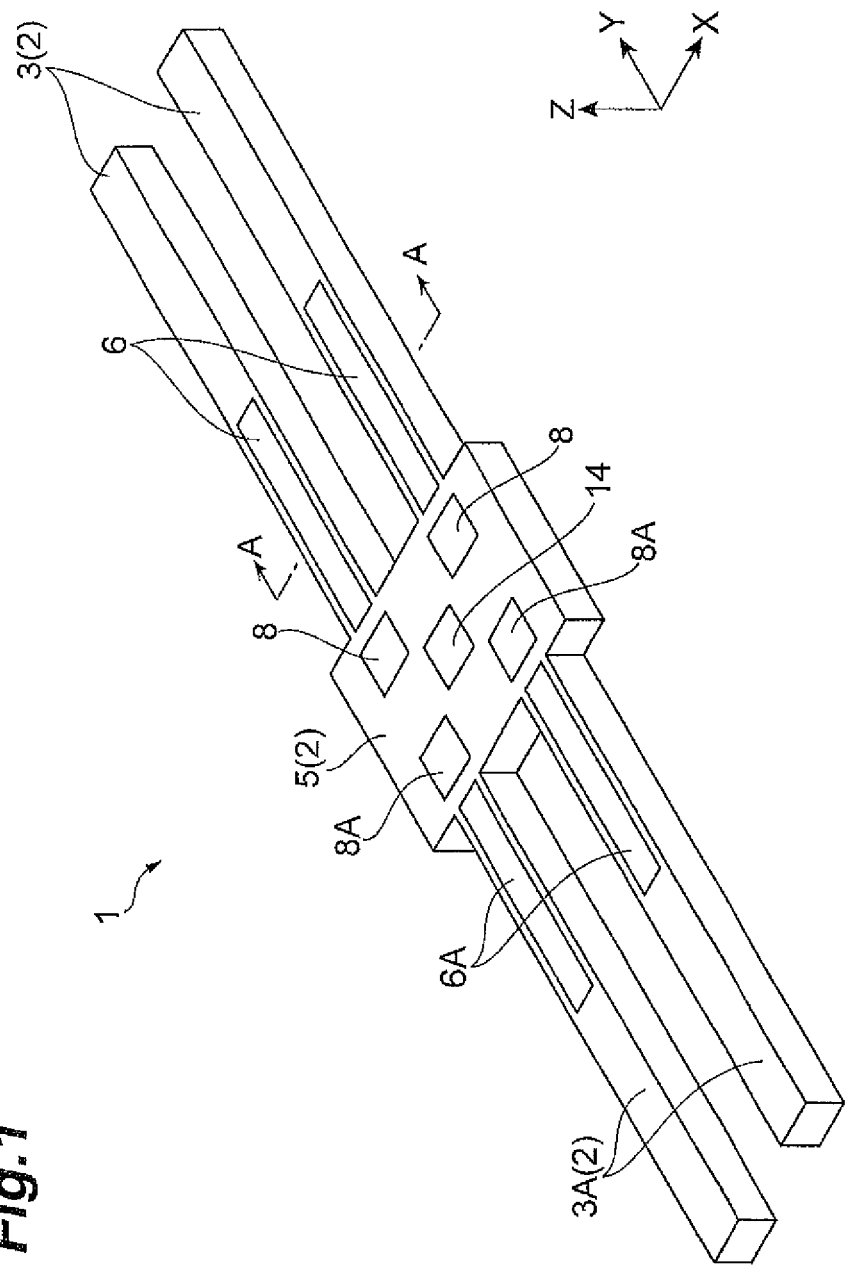
FIG. 1 is a perspective view illustrating an angular velocity sensor according to the present embodiment.
Figure 2:
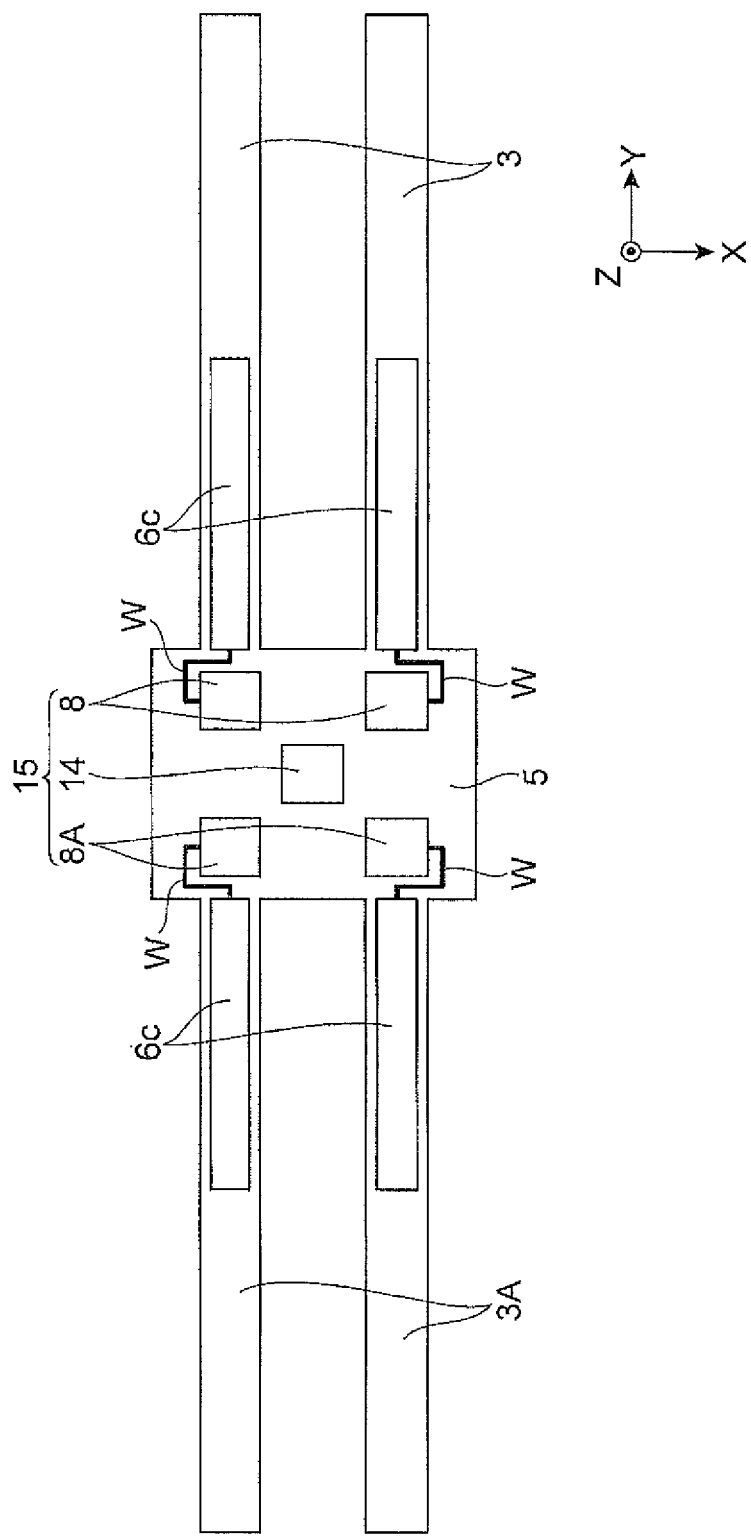
FIG. 2 is a top view illustrating the angular velocity sensor according to the present embodiment.

First, a configuration of an angular velocity sensor 1 according to the present embodiment will be described with reference to FIGS. 1 and 2. FIG. 1 is a perspective view illustrating an angular velocity sensor according to the present embodiment. FIG. 2 is a top view illustrating the angular velocity sensor according to the present embodiment (a piezoelectric element is illustrated while films other than an upper electrode film 6c are omitted).

The angular velocity sensor 1 includes, as illustrated in FIGS. 1 and 2, a base 5, a pair of drive arms 3 and 3 extending in parallel in a certain direction from the base 5, and a pair of detection aims 3A and 3A extending in parallel in a direction different from the extending direction of the pair of drive arms 3 and 3. The base 5, the pair of drive arms 3 and 3, and the pair of detection aims 3A and 3A are integrally formed such that etching processing is applied to a substrate 2 made of silicon (Si).

The drive arms 3 and 3 are made of cantilevers, one ends of which are coupled with the base 5, and extending in the illustrated Y direction (longitudinal direction). That is, in the present embodiment, the two drive arms 3 and 3 are coupled with the base 5, and are arranged in approximately parallel. As described above, only one ends of the drive arms 3 and 3 are coupled with the base 5, and the other ends are free ends. The drive arms 3 and 3 can cause end parts that are the free ends to vibrate in the illustrated X direction. Each of the drive arms 3 and 3 has a piezoelectric element 6 formed on the arm, and the piezoelectric element 6 includes a drive electrode part that is made by a piezoelectric film sandwiched by electrode films. This drive electrode part functions as a drive electrode.

The detection arms 3A and 3A are made of cantilevers, one ends of which are coupled with the base 5, and extending in the illustrated Y direction. That is, in the present embodiment, the two detection arms 3A and 3A are coupled with the base 5, and are arranged in approximately parallel. As described above, only one ends of the detection arms 3A and 3A are coupled with the base 5, and the other ends are free arms. The detection arms 3A and 3A can cause end parts that are the free ends to vibrate in the illustrated Z direction. Each of the detection arms 3A and 3A has a piezoelectric element 6A on the arm, and the piezoelectric element 6A includes a detection electrode part that is made by a piezoelectric film sandwiched by electrode films. This detection electrode part functions as a detection electrode. Here, the drive arms 3 and 3, and the detection arms 3A and 3A extend in opposite directions across the base 5. That is, the angular velocity sensor 1 in the present embodiment exhibits so-called an H-shape. Note that the length of the piezoelectric element 6 in the Y direction is favorably from 30% to 60% (both inclusive) of the length of the drive arm 3 in the Y direction. In this case, a volume component becomes necessary minimum, and thus there is an effect to improve an S/N ratio. The length of the piezoelectric element 6A in the Y direction is favorably from 30% to 60% (both inclusive) of the length of the detection arm 3A in the Y direction. In this case, the capacity component becomes necessary minimum, and thus there is an effect to improve the S/N ratio.

The base 5 is positioned in the center of the angular velocity sensor 1, and exhibits an approximately rectangular shape. The base 5 includes a base electrode part 15 for input/output signal extraction on one principal plane, and the other principal plane serves as a fixation part connected with a package (not illustrated).

The base electrode part 15 includes upper electrode pad parts 8 and 8A, and a lower electrode pad part 14. In the present embodiment, the base electrode part 15 is configured from the four upper electrode pad parts 8, 8, 8A, and 8A and the one lower electrode pad part 14.

The upper electrode pad parts 8 and 8 are provided in vicinities of parts coupled with the drive arms 3 and 3 on the one principal plane of the base 5, and are electrically connected with the drive electrode parts through wires W (see FIG. 2). To be specific, the upper electrode pad parts 8 and 8 are electrically connected with second electrode films 6c (see FIG. 3) of the piezoelectric elements 6 that configure the drive electrode parts. The upper electrode pad parts 8A and 8A are provided in vicinities of parts coupled with the detection arms 3A and 3A on the one principal plane of the base 5, and are electrically connected with the detection electrode parts through wires W. To be specific, the upper electrode pad parts 8A and 8A are electrically connected with second electrode films 6c (see FIG. 3) of the piezoelectric elements 6A that configure the detection electrode parts. Further, the upper electrode pad parts 8 and 8A are connected with an external electrical circuit (not illustrated). An example of a method of connecting the upper electrode pad parts with the external electrical circuit includes a wire bonding method.

The lower electrode pad part 14 is provided in an approximately center of the base 5. The lower electrode pad part 14 is electrically connected with the drive electrode parts and the detection electrode parts. To be specific, the lower electrode pad part 14 is electrically connected with first electrode films 6a (see FIG. 3) of the piezoelectric elements 6 and 6A that configure the drive electrode parts and the detection electrode parts. Further, the lower electrode pad part 14 is connected with an external electrical circuit (not illustrated). An example of a method of connecting the lower electrode pad part with the external electrical circuit includes a connection method by wire bonding.

Here, a mechanism that the angular velocity sensor 1 detects the angular velocity will be described. An alternating voltage is applied to the piezoelectric elements 6 that configure the drive electrode parts of the two drive arms 3 and 3 through the base electrode part 15 to excite the two drive arms 3 and 3 that include the drive electrode parts. At this time, phases of the voltages applied to the piezoelectric elements 6 that configure the respective drive electrode parts of the two drive arms 3 and 3 are shifted by 180°, so that the two drive arms 3 and 3 vibrate to open/close in the illustrated X direction (drive vibration direction). That is, the two drive arms 3 and 3 are caused to be in a state of vibration in which one of the drive arms 3 is tilted in one direction while the other drive arm 3 is tilted in the opposite direction. When the angular velocity sensor 1 is caused to perform an angular velocity motion around an axis parallel to the extending direction of the drive arms 3 and 3 while the drive arms 3 and 3 perform such vibration, the drive arms 3 and 3 are distorted in an up and down direction by the Coriolis' force, and vibration in the illustrated Z direction (detection vibration direction) is generated. When this vibration is transmitted to the detection arms 3A and 3A through the base 5, vibration in the illustrated Z direction (detection vibration direction) is generated in the detection arms 3A and 3A. Due to the vibration, a potential is caused in the piezoelectric elements 6A that configure the detection electrode parts. The potential is detected through the base electrode part 15, as a detection signal, whereby the angular velocity provided to the angular velocity sensor 1 can be detected.

Figure 3:
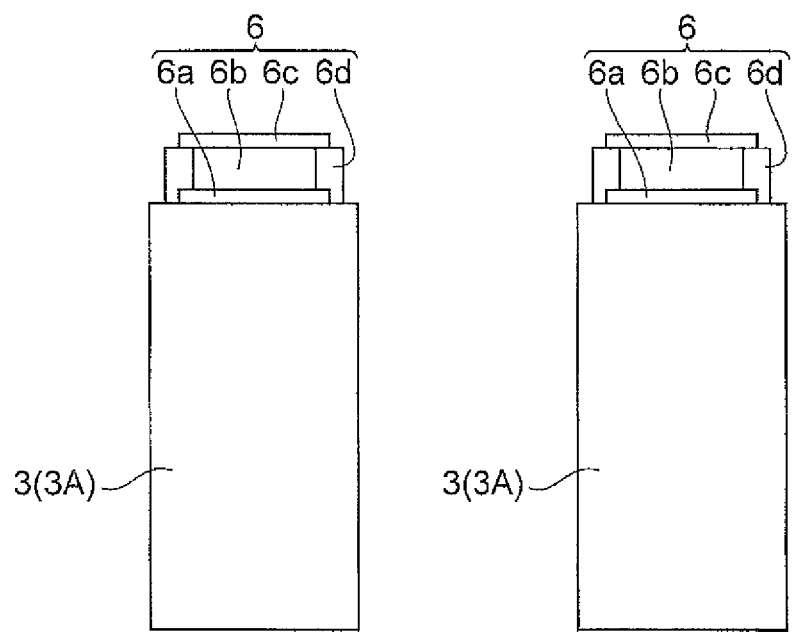
FIG. 3 is a schematic cut diagram illustrating a configuration of an angular velocity sensor 1 along the A-A line in FIG. 1.

Next, configurations of the piezoelectric elements 6 that configure the drive electrode parts and the detection electrode parts of the angular velocity sensor 1 according to the present embodiment will be described in detail with reference to FIG. 3. FIG. 3 is a schematic cut diagram illustrating a configuration of the angular velocity sensor 1 along the A-A line in FIG. 1. Since structures of the drive arms 3 and the detection arms 3A are the same, only the structure of the drive arm will be described in FIG. 3.

The piezoelectric element 6 includes the first electrode film 6a, a piezoelectric film 6b, the second electrode film 6c, and an organic resin film 6d. To be specific, the first electrode film 6a, the piezoelectric film 6b, and the second electrode film 6c form a layered structure on the substrate 2 in that order. That is, the first electrode film 6a corresponds to a lower electrode, and the second electrode film 6c corresponds to an upper electrode.

The piezoelectric film 6b is formed on the first electrode film 6a. The piezoelectric film 6b is, for example, a perovskite-type composite oxide expressed by a general formula $ABO_3$. Here, as A, it is favorable to contain at least one type selected from calcium (Ca), barium (Ba), strontium (Sr), lead (Pb), potassium (K), sodium (Na), lithium (Li), lanthanum (La), and cadmium (Cd), and as B, it is favorable to contain at least one type selected from titanium (Ti), zirconium (Zr), tantalum (Ta), and niobium (Nb). To be specific, as a material of the piezoelectric film 6b, lead zirconate titanate (PZT), lead magnesium niobate-PZT based (PMN-PZT), lead nickel niobate-PZT based (PMN-PZT), lead magnesium niobate-PT based (PMN-PT), or lead nickel niobate-PT based (PMN-PT) materials are favorable. Among them, lead zirconate titanate (PZT) that has excellent piezoelectric characteristics is favorable. As the piezoelectric film, KNN (potassium/niobium/sodium) or the like can be used.

The first electrode film 6a is formed on the substrate 2. That is, the first electrode film 6a is provided between the substrate 2 and one surface of the piezoelectric film 6b. An outer contour of the first electrode film 6a is positioned outside an outer contour of the piezoelectric film 6b as viewed in a layering direction. While a material of the first electrode film 6a may just be a conductive material suitable for control of crystal orientation of the piezoelectric film 6b and is not especially limited, platinum (Pt), iridium (Ir), palladium (Pd), and the like are favorable. In addition, gold (Au), copper (Cu), and titanium (Ti) are exemplified. These materials may be combined and layered.

The second electrode film 6c is formed on the piezoelectric film 6b. That is, the second electrode film 6c is provided on the other surface of the piezoelectric film 6b. An outer contour of the second electrode film 6c is positioned outside the outer contour of the piezoelectric film 6b as viewed in the layering direction. While a material of the second electrode film 6c may just be a conductive material suitable for control of crystal orientation of the piezoelectric film 6b and is not especially limited, platinum (Pt), gold (Au), an aluminum alloy, and the like are favorable. In addition, copper (Cu) and titanium (Ti) are exemplified. These materials may be combined and layered. Note that the respective films of the first electrode film 6a, the piezoelectric film 6b, and the second electrode film 6c can be formed by a vacuum evaporation method or a sputtering method.

The organic resin film 6d is provided to cover a side surface of the piezoelectric film 6b, and surfaces of the first electrode film 6a and the second electrode film 6c, the surfaces facing each other in the layering direction and positioned outside the outer contour of the piezoelectric film 6b. To be specific, the organic resin film 6d covers the entire side surface and a part of an upper surface (a surface facing the second electrode film 6c) of the first electrode film 6a, the entire side surface of the piezoelectric film 6b, and a part of a lower surface (a surface facing the first electrode film 6a) of the second electrode film 6c. That is, a side surface and an upper surface (a surface opposite to the surface facing the first electrode film 6a) of the second electrode film 6c are not covered with the organic resin film 6d. As described above, since the organic resin film 6d does not cover the upper surface of the second electrode film 6c, an increase in the thickness of the piezoelectric element 6 can be suppressed. As a result, an increase in rigidity of the drive arms 3 and 3 and the detection arms 3A and 3A of the angular velocity sensor 1 in the detection vibration direction, and a decrease in a detection vibration level and sensitivity as a sensor, due to an increase in the thickness of the piezoelectric element 6, can be prevented. A material of the organic resin film 6d is not especially limited as long as the material is used as an insulating protection member. However, a polyimide resin is exemplified. The organic resin film 6d can be formed by a spin coating method.

Next, a method of manufacturing the angular velocity sensor 1 that includes the above-described configuration will be described.

First, the substrate 2 that is a disk-shaped wafer made of silicon is prepared. Next, the piezoelectric elements 6 that configure the two drive electrode parts, and the piezoelectric elements 6A that configure the two detection electrode parts are formed on the substrate 2. Each piezoelectric element is formed as follows. A conductive film made of platinum (Pt) is formed with a desired film thickness on the substrate 2 by a vacuum evaporation method or sputtering, so that the first electrode film 6a corresponding to the lower electrode is formed, the piezoelectric film 6b made of lead zirconate titanate (PZT) is formed with a desired film thickness on the first electrode film 6a by sputtering, and a conductive film made of platinum (Pt) is formed with a desired film thickness on the piezoelectric film 6b by sputtering, so that the second electrode film 6c corresponding to the upper electrode is formed.

Following that, each of the formed thin films is processed into a pattern shape of desired drive electrode part and detection electrode part by photo lithography and etching. Here, each of the piezoelectric elements 6 is formed such that the outer contour of the first electrode film 6a and the outer contour of the second electrode film 6c are positioned outside the outer contour of the piezoelectric film 6b as viewed in the layering direction. Further, a polyimide resin to serve as the organic resin film 6d is applied and formed by a spin coating method. The organic resin film 6d is formed to cover the side surface of the piezoelectric film 6b, and the surfaces of the first electrode film 6a and the second electrode film 6c, the surfaces facing each other in the layering direction and positioned outside the outer contour of the piezoelectric film 6b.

Following that thin films are formed, and the substrate 2 processed into the pattern shape is separated into an element shape by silicon etching and dicing, so that the angular velocity sensor 1 can be obtained.

As described above, in the angular velocity sensor 1 according to the present embodiment, the outer contours of the first electrode films 6a and the outer contours of the second electrode films 6c of the piezoelectric elements 6 and 6A that configure the drive electrode parts and the detection electrode parts of the angular velocity sensor 1 are positioned outside the outer contours of the piezoelectric films 6b as viewed in the layering direction. Therefore, resistivity is decreased, and power consumption can be decreased. Here, as a method of decreasing the resistivity of the electrode films, a method of increasing the thickness of the electrode films can be considered. However, if the thickness of the electrode films is increased, the thickness of the piezoelectric element 6 is increased, and thus the rigidity of the drive arms and the detection arms of the angular velocity sensor in the detection vibration direction is increased, and the detection vibration level is decreased. Therefore, it is not favorable in terms of the decrease in sensitivity as a sensor. Meanwhile, the angular velocity sensor 1 according to the present embodiment decreases the resistivity of the electrode films with the structure in which the outer contours of the first electrode films 6a and the outer contours of the second electrode films 6c of the piezoelectric elements 6 are positioned outside the outer contours of the piezoelectric films 6b as viewed in the layering direction. Therefore, the angular velocity sensor 1 according to the present embodiment can prevent the decrease in sensitivity as a sensor.

Further, the angular velocity sensor 1 according to the present embodiment further includes the organic resin films 6d provided to cover the side surfaces of the piezoelectric films 6b, and the surfaces of the first electrode films 6a and the second electrode films 6c, the surfaces facing each other in the layering direction and positioned outside the outer contours of the piezoelectric films 6b. In this case, the second electrode film 6c comes in contact with both of the piezoelectric film 6b and the organic resin film 6d, and an adhesion area of the second electrode film 6c is expanded. Therefore, separation from the piezoelectric film 6b can be prevented.

Figure 4:
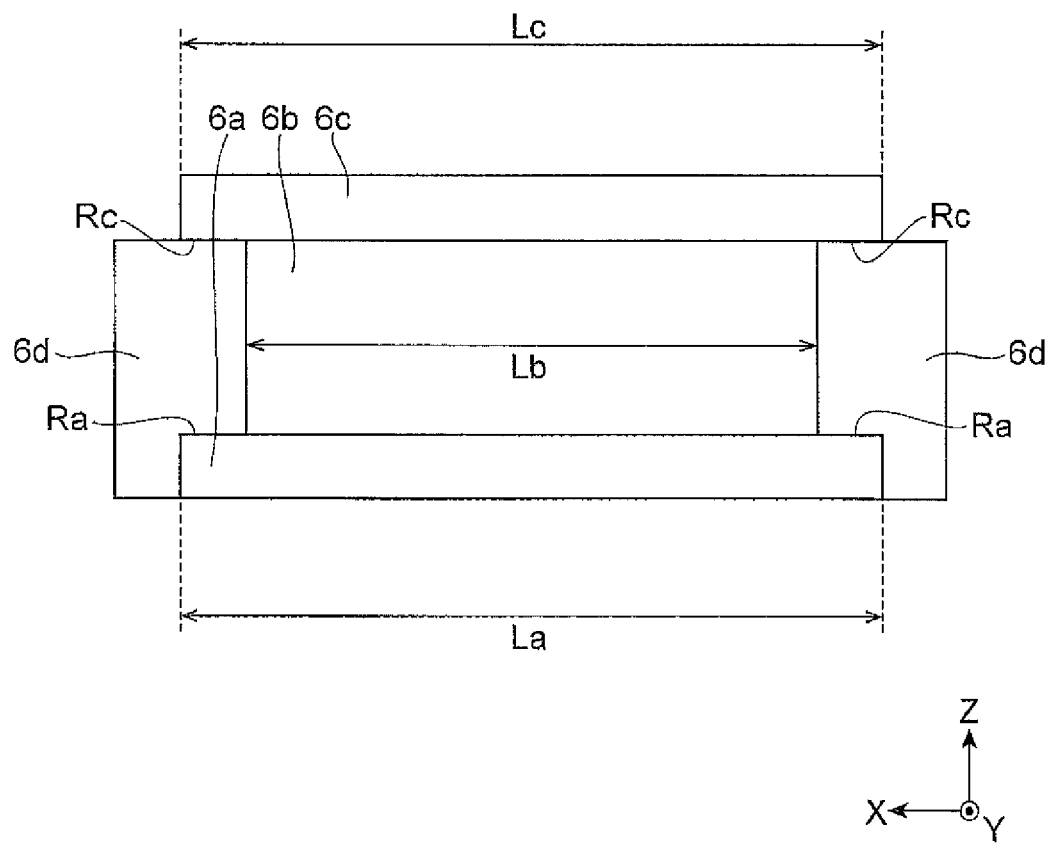
FIG. 4 is a diagram illustrating a vertical cross sectional configuration of a piezoelectric vibrating body.

The structure of the piezoelectric element 6 (6A) will be further described with reference to FIG. 4. The above-described angular velocity sensor includes the drive arms and the detection arms to which the piezoelectric elements are fixed. Each of these piezoelectric elements includes the piezoelectric film 6b, the first electrode film 6a provided on the one surface side of the piezoelectric film 6b, and the second electrode film 6c provided on the other surface side of the piezoelectric film 6b. The direction (X) perpendicular to both of the longitudinal direction (Y) of the drive arms and the thickness direction (Z) of the piezoelectric film 6b is a width direction. A dimension La of the first electrode film 6a in the width direction, a dimension Lc of the second electrode film 6c in the width direction, and a dimension Lb of the piezoelectric film 6b in the width direction have relationship below:

$$Lc \times 0.95 \leq La \leq Lc \times 1.05 \quad (1)$$

$$Lb < La \quad (2)$$

$$Lb < Lc \quad (3)$$

According to the angular velocity sensor, La and Lc are approximately equal (an error is 5%), and thus the piezoelectric elements perform harmonized vibration. Further, Lb is smaller than La and Lc, and thus the voltage is reliably and uniformly applied to the piezoelectric film through the electrodes. Therefore, the noise mixed in the detection signal due to the vibration of the piezoelectric element can be suppressed. Note that the detection signal can be taken out of the piezoelectric element provided on the drive arm, or can be taken out of the piezoelectric element provided on the detection arm mechanically coupled with the drive arm.

Further, the organic resin film 6d of the piezoelectric element is provided to be in contact with at least: (1) the side surface of the piezoelectric film 6b along a plane including both of the longitudinal direction (Y) and the thickness direction (Z); (2) a region Re that is a surface region of the second electrode film 6c positioned outside the piezoelectric film 6b in the width direction, and facing the first electrode film 6a; and (3) a region Ra that is a surface region of the first electrode film 6a positioned outside the piezoelectric film 6b in the width direction, and facing the second electrode film 6c.

According to the angular velocity sensor, the piezoelectric element is covered with the organic resin film 6d, so that the vibration of the parts of the electrode films protruding toward sides is suppressed, and the vibration becomes stable. Therefore, inclusion of the noise in the detection signal can be suppressed.

As described above, the piezoelectric element includes the piezoelectric film, the first electrode film provided on one surface side of the piezoelectric film, and the second electrode film provided on the other surface side of the piezoelectric film, and the outer contour of the first electrode film and the outer contour of the second electrode film are layered such projection surfaces through the piezoelectric film become approximately the same. According to the piezoelectric element of the present invention, the piezoelectric film is sandwiched by two or more electrode films having approximately the same shape. When the electrode films have the same shape, distortion of the vibration caused by the shape can be suppressed. Therefore, abnormal vibration caused by the electrode films cannot be superimposed on the vibration of the drive electrode part, and deformation caused only by the vibration of the drive electrode part applied to the piezoelectric film. As a result, the noise caused by the electrode films is suppressed, and accurate measurement of the angular velocity becomes possible.

Further, it is favorable that the outer contours of the first electrode film and the second electrode film of the piezoelectric element are positioned outside the outer contour of the piezoelectric film as viewed in the layering direction. In the piezoelectric element, the outer contours of the first and second electrode films are larger than the outer contour of the piezoelectric film, and thus the vibration of the drive electrode part (the layered body made of 6a to 6c) is applied to a front surface of the piezoelectric film without including the abnormal vibration of the electrode films, through the first and second electrode films. Therefore, it is more favorable in terms of noise suppression effect.

It is favorable that the piezoelectric element further includes the organic resin film (insulating film) provided to cover the side surface of the piezoelectric film, and the surfaces of the first electrode film and the second electrode film, the surfaces facing each other in the layering direction and positioned outside the outer contour of the piezoelectric film. In this case, the vibration applied to the first and second electrode films from parts other than the drive electrode part can be suppressed. Therefore, it is more favorable in terms of the noise suppression effect.

The above-described angular velocity sensor includes the piezoelectric elements, and the angular velocity sensor that suppresses generation of noise can be obtained.

The above-described angular velocity sensors were produced.

Experiment conditions of respective examples are as follows.

Example 1

First, a zirconium oxide film with the thickness of about 15 nm as a buffer layer, an yttrium oxide film with the thickness of about 40 nm as a seed layer, and a platinum film with the thickness of about 50 nm as a lower electrode layer, were formed on an element substrate made of silicon by a vacuum evaporation method while heating the substrate to about 1000° C. By doing so, the platinum film becomes a film preferably oriented in a (100) plane. Further, to secure the thickness of the lower electrode layer, after a platinum film with the thickness of about 150 nm was formed by a sputtering method, a lead zirconate titanate (hereinafter, described as PZT) film with the thickness of about 2000 nm was similarly formed in succession as the piezoelectric layer by the sputtering method. A substrate heating temperature of this time was about 700° C., and the PZT film becomes a film preferably oriented in (001).

Next, after a photosensitive photoresist was applied on the entire surface and dried, the photoresist was exposed and developed over a photo mask formed in a pattern shape of the piezoelectric layer, so that a mask pattern of the photoresist was formed. Then, patterning of the piezoelectric layer was performed by dry etching. After the patterning was performed to a depth to which the piezoelectric layer is dry etched, the photoresist was separated. Next, after a photosensitive photoresist was applied on the entire surface and dried, the photoresist was exposed and developed over a photo mask formed in the pattern shape of the lower electrode layer, so that a mask pattern of the photoresist was formed. Then, patterning from the lower electrode layer to the seed layer was performed by dry etching. After the patterning was performed to the depth to which the seed layer is dry etched, the photoresist was separated. Next, a photosensitive photoresist was applied on the entire surface and dried, the photoresist was exposed and developed over a photo mask formed in a pattern shape of the upper electrode layer, so that a mask pattern of the photoresist was formed. Then, after a chromium film with the thickness of about 10 nm as an adhesion layer, and a gold film with the thickness of about 200 nm as an upper electrode layer 2E were formed on the entire surface by an unheated sputtering method, the photoresist portion was separated by a lift-off method. When the plane size of each layer of the obtained piezoelectric part was measured with a length measuring microscope, the upper electrode layer was 150.5×552 µm, the piezoelectric layer was 150×550 and the lower electrode layer was 152×552 µm.

After the piezoelectric part was formed, thickness adjustment of the element substrate was performed. In the thickness adjustment, a surface opposite to the surface where the piezoelectric part of the element substrate was formed was ground, so that the thickness of the element substrate was caused to be 150 µm. After the thickness adjustment, a circuit pattern was formed, and an angular velocity sensor was obtained.

Example 2

An angular velocity sensor was obtained by a similar method to Example 1 except that an upper electrode layer was 152×552 µm, a piezoelectric layer was 150×550 µm, and a lower electrode layer was 152×552 µm in a patterning process.

Example 3

An angular velocity sensor was obtained by a similar method to Example 2 except that a lower electrode layer was formed by dry etching, then a photosensitive polyimide resin to serve as an organic resin film 6d was applied on the entire surface of the lower electrode layer and dried, then polyimide was exposed and developed over a photo mask formed in a desired pattern shape to form polyimide, in a patterning process.

Comparative Example

An angular velocity sensor was obtained by a similar method to Example 1 except that an upper electrode layer was 148×548 µm, a piezoelectric layer was 150×550 µm, and a lower electrode layer was 152×552 µm.

(Evaluation of S/N Ratios)

S/N ratios of vibration gyro elements (angular velocity sensor) of Examples and Comparative Example were measured. Here, the S/N ratio is a ratio of a signal S and noise N, and is a ratio of an angular velocity signal S generated in the detection electrodes when the vibration gyro element is rotated, and noise N generated in the detection electrodes due to transmission of the vibration of the drive arms to the detection aims when the vibration gyro element is not rotated. Measurement of the S/N ratios of the vibration gyro elements was performed as follows. First, the drive arms of the vibration gyro element were caused to vibrate by a self-excited oscillation circuit. The vibration of the drive anus was transmitted to the detection arms through the base, and a noise voltage was generated in the detection electrodes. The noise potential was detected by a multimeter through a detection circuit. Next, a rotating motion around the illustrated Y axis in FIG. 1 was provided to the vibration gyro element fixed to an evaluation board 200, with a turntable (not illustrated). Then, the vibration generated in the drive arms in the illustrated Z axis direction in FIG. 1 was transmitted to the detection arms through the base. Then, the vibration in the illustrated Z axis direction was generated in the detection arms, and thus the angular velocity signal was detected by the multimeter through the detection electrodes. The evaluation results of the recorded S/N ratios that are ratios of the detected angular velocity signals S and noise N are described below. Note that, for the evaluation of the S/N ratios, two vibration gyro elements produced by the manufacturing method according to Examples, and two vibration gyro elements produced by the manufacturing method according to Comparative Example were prepared. Further, the vibration gyro elements produced by the manufacturing method according to Comparative Example were produced under a condition in which a cross section of the element including a vibration part is formed into a trapezoid when etching processing by a Bosch method is performed for suppression of chipping.

(Evaluation Results of S/N Ratios)

The S/N ratio of Comparative Example was $1.5 \times 10^{-3}$, the S/N ratio of Example 1 was $2.0 \times 10^{-3}$, the S/N ratio of Example 2 was $2.3 \times 10^{-3}$, and the S/N ratio of Example 3 was $2.5 \times 10^{-3}$. The S/N ratios of Examples 1, 2, and 3 are more excellent than the S/N ratio of Comparative Example, and the S/N ratios of the detection signals are improved.

As described above, favorable embodiments of the present invention have been described. However, the present invention is not necessarily limited to the above embodiments, and various changes can be made without departing from the gist of the present invention. Further, the above-described configuration elements include elements that can be easily expected by a person skilled in the art, and substantially the same. Further, the above-described configuration elements can be appropriately combined. Further, various omissions, replacements, and changes of the configuration elements can be performed without departing from the gist of the present invention.

For example, the H-shaped angular velocity sensor 1 has been described in the present embodiment. However, the shape is not limited to the embodiment, and angular velocity sensors having various shapes such as a pillar-shaped sensor and a tuning fork-shaped sensor are adaptable. Any shaped angular velocity sensor can suppress generation of noise as long as a drive electrode part and a detection electrode part include the configurations of the piezoelectric elements 6 and 6A according to the present embodiment.

The angular velocity sensor including the piezoelectric elements according to the present invention can be used for detection of angular velocity by rotation of a substance, such as an automobile, a car navigation, a handshake prevention camera.

What is claimed is:

1. An angular velocity sensor including a drive arm to which a piezoelectric element is fixed,
   the piezoelectric element comprising:
   a piezoelectric film;
   a first electrode film provided on one surface side of the piezoelectric film; and
   a second electrode film provided on the other surface side of the piezoelectric film, wherein
   a dimension La of the first electrode film in a width direction, a dimension Lc of the second electrode film in the width direction, and a dimension Lb of the piezoelectric film in the width direction satisfy following relationship:

$Lc \times 0.95 \leq La \leq Lc \times 1.05$, $Lb < La$, $Lb < Lc$, when a direction perpendicular to both of a longitudinal direction of the drive arm and a thickness direction of the piezoelectric film is the width direction.

2. The angular velocity sensor according to claim 1, wherein
   the piezoelectric element further comprises an organic resin film provided to be in contact with at least
   a side surface of the piezoelectric film along a plane including both of the longitudinal direction and the thickness direction,
   a region that is a surface region of the second electrode film positioned outside the piezoelectric film in the width direction, and facing the first electrode film, and
   a region that is a surface region of the first electrode film positioned outside the piezoelectric film in the width direction, and facing the second electrode film.

* * * * *